United States Patent
Jacquet et al.

(10) Patent No.: US 9,203,415 B2
(45) Date of Patent: Dec. 1, 2015

(54) MODULATED CLOCK SYNCHRONIZER

(71) Applicant: ST-Ericsson SA, Plan-les-Ouates (CH)

(72) Inventors: David Jacquet, Vaulnaveys-le-Haut (FR); Philip O'Shea, Engins (FR); Jacques Prunier, Sassenage (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/369,118

(22) PCT Filed: Jan. 22, 2013

(86) PCT No.: PCT/EP2013/051149
§ 371 (c)(1),
(2) Date: Jun. 26, 2014

(87) PCT Pub. No.: WO2013/110613
PCT Pub. Date: Aug. 1, 2013

(65) Prior Publication Data
US 2014/0333360 A1    Nov. 13, 2014

Related U.S. Application Data

(60) Provisional application No. 61/597,379, filed on Feb. 10, 2012.

(30) Foreign Application Priority Data

Jan. 26, 2012   (EP) ..................................... 12305105

(51) Int. Cl.
*H03K 5/135* (2006.01)
*H03L 7/00* (2006.01)
(Continued)

(52) U.S. Cl.
CPC .. *H03L 7/00* (2013.01); *G06F 1/12* (2013.01); *H04L 7/0037* (2013.01); *H03K 5/135* (2013.01)

(58) Field of Classification Search
CPC ......... H03K 5/13; H03K 5/131; H03K 5/132; H03K 5/133; H03K 5/135
USPC ......................................... 327/261, 262, 290
See application file for complete search history.

(56) References Cited

U.S. PATENT DOCUMENTS 5,534,805 A * 7/1996 Miyazaki et al. ............. 327/144
5,764,710 A    6/1998 Cheng et al.
6,009,531 A   12/1999 Selvidge et al.
(Continued)

OTHER PUBLICATIONS

International Search Report issued in corresponding International application No. PCT/EP2013/051149, date of mailing Feb. 28, 2013.
(Continued)

*Primary Examiner* — John Poos
(74) *Attorney, Agent, or Firm* — Patent Portfolio Builders PLLC (57) ABSTRACT

The present invention relates to a signal synchronization circuit comprising at least one synchronizer (2.1-2.2) comprising a number N of series connected clock delay elements (3.1-3.3), N being equal to or greater than unity and a clock signal generator (1) arranged for generating a modulated clock signal adapted to clock the clock delay element (3.1-3.3) or elements of the at least one synchronizer (2.1-2.2). The clock generator (1) is arranged to receive a clock signal (5) and at least one operating value (6) and to generate the modulated clock signal (1 out) from the clock signal (5) modified based on the operating value (6).

16 Claims, 4 Drawing Sheets (51) Int. Cl.
*G06F 1/12* (2006.01)
*H04L 7/00* (2006.01)

(56) References Cited

U.S. PATENT DOCUMENTS

| 7,221,126 | B1 | 5/2007 | Williamson et al. |
| 2005/0216247 | A1 | 9/2005 | Ikeda et al. |
| 2008/0191768 | A1 | 8/2008 | Miki et al. |

OTHER PUBLICATIONS

Written Opinion of the International Searching Authority issued in corresponding International application No. PCT/EP2013/051149, date of mailing Feb. 28, 2013.

Extended European Search Report issued in corresponding European application No. EP 12 30 5105, date of completion Jun. 25, 2012.

* cited by examiner

MODULATED CLOCK SYNCHRONIZER

BACKGROUND OF THE INVENTION

1. Technical Field

The present invention generally relates to signal synchronization between clock domains of Integrated Circuits.

It finds applications, in particular, while not exclusively, in System-On-a Chip Integrated Circuits having a plurality of different clock domains.

2. Related Art

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Modem System-On-a-Chip (SOC) Integrated Circuits (ICs) currently include several clock domains and thus are asynchronous systems from the perspective of one clock domain to the others. Signals that are exchanged between different clock domains are crossing boundaries between a source clock domain and a destination source domain, and are thus asynchronously transmitted.

Such signals need to be resynchronized in order to resolve errors which may result from sampling incoming signals in a setup or hold window of flip-flops comprised in the SOC IC.

Synchronization is currently performed in synchronizers containing a fixed number of flip-flops that are serially connected.

The number of flip-flops is determined by a number of parameters, such as clock frequency of the source and destination domains, operating voltage or recovery time of used flip-flops. The number of needed flip-flops is generally computed according to the worst use case, thus leading to an important number of serial flip-flops to support all the possible cases. Indeed, in case of occurrence of an asynchronous event such as, for instance a resetting order, the recovery time of a flip-flop depends on the supply voltage. The recovery time increases when the supply voltage decreases. To enable the flip-flops to more promptly recover synchronization, the number of flip-flops in the synchronizer has to be increased (up to two or three times the original number) for a given sampling rate per synchronizer when the supply voltage is decreasing and if the running frequency is adjusted to the maximum possible one.

However, increasing the number of flip-flops quickly becomes unacceptable in terms of power consumption and die area. Moreover, this strategy is also leading to very long synchronization latency, even when a smaller number of clock delay elements are needed for operation in other conditions.

Thus, there is a need to perform synchronization in asynchronous systems, while ensuring a low power and die area consumption.

SUMMARY OF THE INVENTION

To address these needs, the present invention proposes a signal synchronization circuit comprising:
- at least one synchronizer comprising a number N of series connected clocked delay elements, e.g flip-flops, N being equal to or greater than unity; and,
- a clock signal generator arranged for generating a modulated clock signal adapted for clocking the clock delay element or elements of the at least one synchronizer, the clock generator being arranged to receive a clock signal and at least one operating value and to generate the modulated clock signal from the clock signal modified based on the operating value.

Thus the present invention enables a dynamic reconfiguration of the synchronizers, which is based on a received operating value, done by modulating the clock of a destination clock domain (via clock pulse removal for example) in order to increase the synchronization overall time interval. By removing clock pulses, additional virtual clock delay elements can be simulated in the synchronizer. This means that the synchronizer may operate as if it contained more clock delay elements than it actually has. The example of flip-flops is considered hereafter to represent the concept of clock delay element. However, no restriction is attached to this concept, which can also include synchronous logic gates for example.

The invention achieves an optimal tuning of the synchronizer latency with the lowest possible failure rate, as reflected by, for instance, the Mean Time Between Failures (MTBF) at current process, voltage and temperature conditions, which can result from appropriate choice of the operating value.

Switching between two operating configurations, each configuration being defined by one respective operating value, may further remain transparent to the system.

According to some embodiments, the operating value is tied to, preferably is representative of the number N of clock delay elements of the synchronizer, e.g., is equal to N.

Thus, an operating value among several operating values can define the number of clock delay elements already physically present in the synchronizer, which helps defining the number of virtual clock delay elements to be simulated.

In some embodiments, the operating value is tied to a desired increase in a synchronization time shift introduced by the synchronizer.

By defining an increase in a synchronization time shift, the circuit can determine a number of virtual clock delay elements to be simulated by clock pulse removal, in order to reach the new synchronization time shift, and thus to enable a sufficient time for the clock delay elements to recover in case of an asynchronous event.

Alternatively or in complement, the operating value is tied to at least one of a manufacturing process, operation voltage or temperature condition of the synchronizer.

This enables to dynamically define the number of virtual clock delay elements to be simulated based on context parameters that influence the recovery time required by a clock delay element in case of occurrence of an asynchronous event.

According to some embodiments, the clock signal generator may further comprise a clock gate with an input and an output, the input being arranged to receive the clock signal and the output being adapted to output the modulated clock signal from the clock signal generator, the clock gate being controlled by a control signal generated by the clock signal generator based on the operating value.

Thus, the clock signal generator can remove clock pulses by using a clock gate. Clock pulses can thus be removed by regularly gating the clock signal to generate a sequence that depends on the number of virtual clock delay elements that have to be generated.

Alternatively, the synchronizer may comprise a clock gate with an input and an output, the input being arranged to receive the clock signal and the output being adapted to output a gated modulated clock signal from the clock signal generator, the clock gate being controlled by the modulated clock signal of the clock signal generator.

Thus, the implementation of embodiments can be adapted from existing synchronizers already having a clock gate. The modulated clock signal can thus be used to control the clock gate of the synchronizer.

In some embodiments, the modulated clock signal may be generated based further on a number M of clock delay elements which are necessary for the synchronizer to introduce a given time shift to the clock signal, M being greater than N, and for a time sequence during which the clock signal comprises M rising edges, the modulated clock signal comprises N rising edges.

Thus, the modulated clock signal comprises a number of clock pulses that enables to simulate the required number of additional virtual clock delay elements.

In complement, the circuit can further comprise a counter, the counter being adapted to update a counter value, and at each rising edge of the clock signal, if the counter value is below a given threshold, the edge of the modulated clock signal is caused to be low and the counter value is incremented by M−N, and else, the edge of the modulated clock signal is caused to be high and the counter value is decremented by N−1.

These embodiments allow simulating virtual clock delay elements, which is cost effective and which can be introduced in existing architectures.

In some embodiments, the circuit comprises at least two synchronizers and the modulated clock signal is adapted for clocking the clock delay element or elements of the synchronizers.

Thus, a single generator can be used by several synchronizers, which is cost effective and enables to reduce the dimensions of such circuit.

A second aspect of the invention concerns a signal synchronization method comprising:
  receiving a clock signal and at least one operating value;
  generating a modulated clock signal from the clock modified from the clock signal modified based on the operating value, the modulated clock signal being adapted for clocking a number N of series connected clock delay elements of at least one synchronizer, N being equal to or greater than unity.

In some embodiments, the modulated clock signal is generated based further on a number M of clock delay elements which are necessary for the synchronizer to introduce a given time shift to the clock signal, M being greater than N, and for a time sequence during which the clock signal comprises M rising edges, the modulated clock signal comprises N rising edges.

In complement, the method can further comprise, at each rising edge of the clock signal:
  if a counter value is below a given threshold, the edge of the modulated clock signal is caused to be low and the counter value is incremented by M−N;
  else, the edge of the modulated clock signal is caused to be high and the counter value is decremented by N−1.

According to some embodiments, the operating value is tied to, preferably is representative of the number N of clock delay elements of the synchronizer, e.g., is equal to N.

Alternatively or in complement, the operating value is tied to at least one of a manufacturing process, operation voltage or temperature condition of the synchronizer.

A third aspect of the invention refers to a computer program product comprising a non-transitory computer readable medium having stored thereon computer program instructions loadable into a computing device and adapted to—when loaded into and executed by said computing device—cause the computing device to perform a method according to anyone of the embodiments of the second aspect of the invention.

BRIEF DESCRIPTION OF THE DRAWINGS

The present invention is illustrated by way of example, and not by way of limitation, in the figures of the accompanying drawings, in which like reference numerals refer to similar elements and in which.

DESCRIPTION OF PREFERRED EMBODIMENTS

Figure 1:
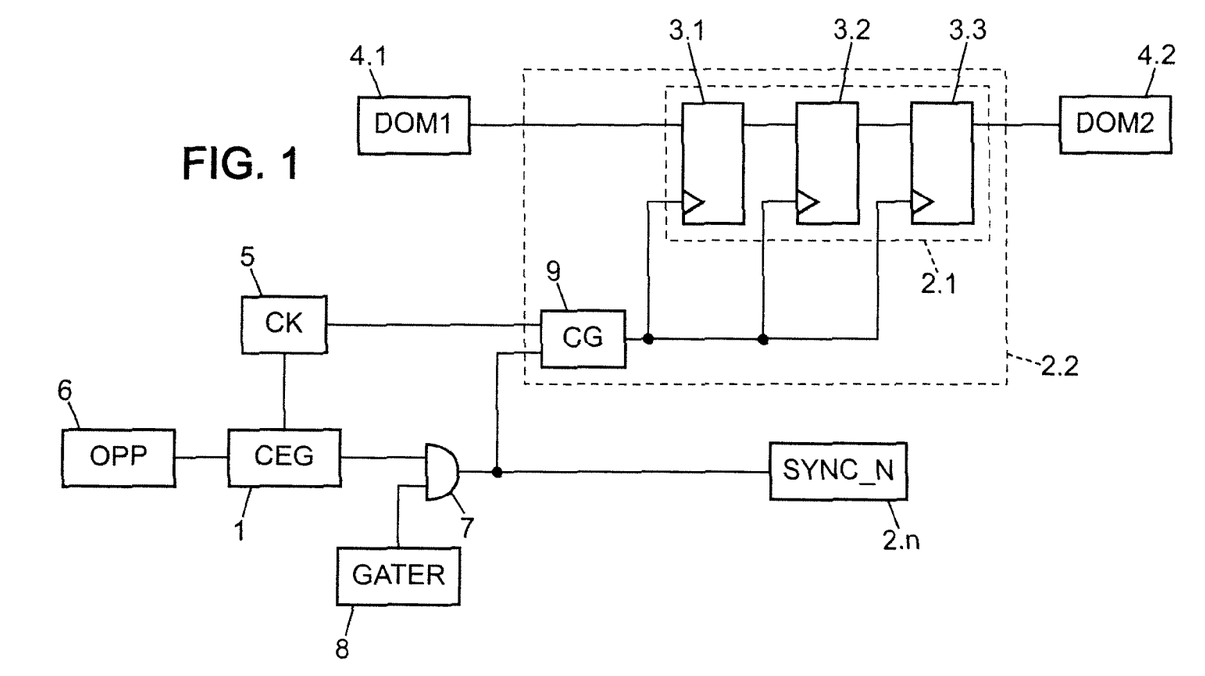
FIG. 1 shows a block diagram of a signal synchronization circuit according to some embodiments.

Referring to FIG. 1, there is shown therein an example of a signal synchronization circuit according to some embodiments.

As shown schematically the circuit comprises a clock signal generator 1 and a synchronizer 2.1-2.2. In a first configuration, the synchronizer 2.1 comprises three clock delay elements, which can be flip-flops, latches or synchronous logic gates that are serially connected. In a second configuration, the synchronizer 2.2 further comprises a clock gate 9. The configuration depends on the nature of the existing synchronizers of the design. In what follows, we consider that the clock delay elements are flip-flops.

The synchronizer is adapted to adapt an asynchronous signal originating from a first clock domain 4.1, to a second clock domain 4.2. To this purpose, according to systems of the prior art, serially connected flip-flops can be toggled at each clock cycle of a local clock 5. The number of serially connected flip-flops is static and does not enable to be dynamically adapted according to supply voltage level, operation frequency, and intrinsic features of the flip-flops for example. The present invention proposes to gate the signal of the clock 5 based on a signal coming from the clock signal generator 1, so that an additional number of virtual flip-flops is created in the synchronizer 2.1-2.2.

The clock signal generator is adapted to receive a clock signal from a local clock 5 and to receive an operating value from an operating point database 6. The operating value can be tied to manufacturing process, operation voltage or temperature condition of the synchronizer. Based on these values, the recovering time of the flip-flops 3.1-3.3 can vary and thus, a number of additional flip-flops can be determined so that the flip-flops have enough time to recover. Thus, the operating value can be noted resync_stage_nb and can be defined by the following equation:

$$\text{resync\_stage\_nb} = \text{total\_number\_ffs} - \text{physical\_number\_ffs}$$

where total_number_ffs is the total number of flip-flops that are required in the synchronizer to ensure a sufficient recovery time for the flip-flops and physical_number_ffs is the physical number of flip-flops 3.1-3.3 in the synchronizer. In the present example, physical_number_ffs is equal to three. However, no restriction is attached to the physical number of flip-flops. The synchronizer 2.1-2.2 is dynamically adjusted by modulating the clock signal of the clock 5, which is performed by the clock signal generator 1 via clock pulse removal in order to increase the synchronization overall time interval to permit recovery of the flip-flops in case of asynchronous event.

The clock signal generator 1 task results in stealing clock pulses at the synchronizer flip-flop level, so as to increase the sampling time and hence the time left to each flip-flop to recover in case of quasi-simultaneous transition of the incoming signal (from first clock domain 4.1) and of the sampling clock edge. It is noted for the purpose of the immediately following discussion that the synchronizer of FIG. 1 has three physical clock delay elements.

TABLE 1

| Emulated number of flip-flops | Enable sequence |
|---|---|
| 3 (full-speed) | constant 1 |
| 4 | 011, 011, 011 |
| 5 | 01, 01, 01, 01 |
| 6 | 00101, 00101, 00101 |
| 7 | 001, 001, 001 |
| 8 | 0001001, 0001001 |

Table 1 describes enable sequences (i.e. the modulated clock signal) generated by the clock signal generator 1 depending on the number of flip-flops to be emulated, which corresponds to total_number_ffs. The enable sequence is transmitted to the clock gate 9, at each clock cycle. Depending on the configuration, the clock gate 9 can be comprised in the synchronizer 2.2 or can be outside the synchronizer 2.1. In the first configuration, the clock gate 9 is outside the synchronizer 2.1 and can be directly inserted in the clock signal generator 1. Each time a zero is transmitted, a clock pulse of the clock 5 is removed. Thus, as the synchronizer 2.1-2.2 contains three physical flip-flops (parameter physical_number_ffs), if three flip-flops are currently required (which is determined based on manufacturing process, operation voltage or temperature condition of the synchronizer, as already explained), the enable sequence only contains a series of 1, as no clock pulse has to be removed. Now, if four flip-flops are currently required, the enable sequence is composed of elements 011,011,011, so that one clock pulse is stolen in each sequence of four clock pulses. It can be seen that the sequence is sometimes irregular because the number of pulses to remove is not a multiple of the number of flip-flops minus one.

Thus, the present invention enables to dynamically adapt the number of flip-flops of the synchronizer 2.1-2.2 to manufacturing process, operation voltage and operation frequency of the second clock domain 4.2 or temperature condition of the synchronizer 2.1-2.2. This is performed while avoiding increasing physically the number of flip-flops 3.1-3.3.

One can consider that the clock signal generator 1 outputs a modulated clock signal, which can be used to control, directly or indirectly, the toggling of the flip-flops. Indeed, clock signal generator can comprise the clock gate 9 according to some embodiments, thus delivering directly a modulated clock signal, which is a gated clock that can be used to toggle the flip-flops 3.1-3.3. Depending on the configuration, the modulated clock signal can be a gated clock or a clock enable.

In the embodiments described on FIG. 1, the modulated clock signal of the clock signal generator 1 can be gated by a gate 7, which is controlled by a gating unit 8. Gating unit 8 can be pre-existing element of the prior art, which was initially used to gate the clock signal of the clock 5 and is adapted to generate a functional clock enable. In the example represented on FIG. 1, the functional clock enable is only used to save power (quasi-static).

The present invention can thus be inserted in existing systems, without any fundamental modification of the structure. The modulated clock signal, when gated by the gate 7, is then transmitted to the clock gate 9 to gate the clock signal of the clock 5, and thus to control the toggling of the flip-flops 3.1-3.3. The gate 7 can also transmit the modulated clock signal to other synchronizers 2.n, having the same clock as the clock 5 and the same functional clock enable (the same gating).

Figure 2:
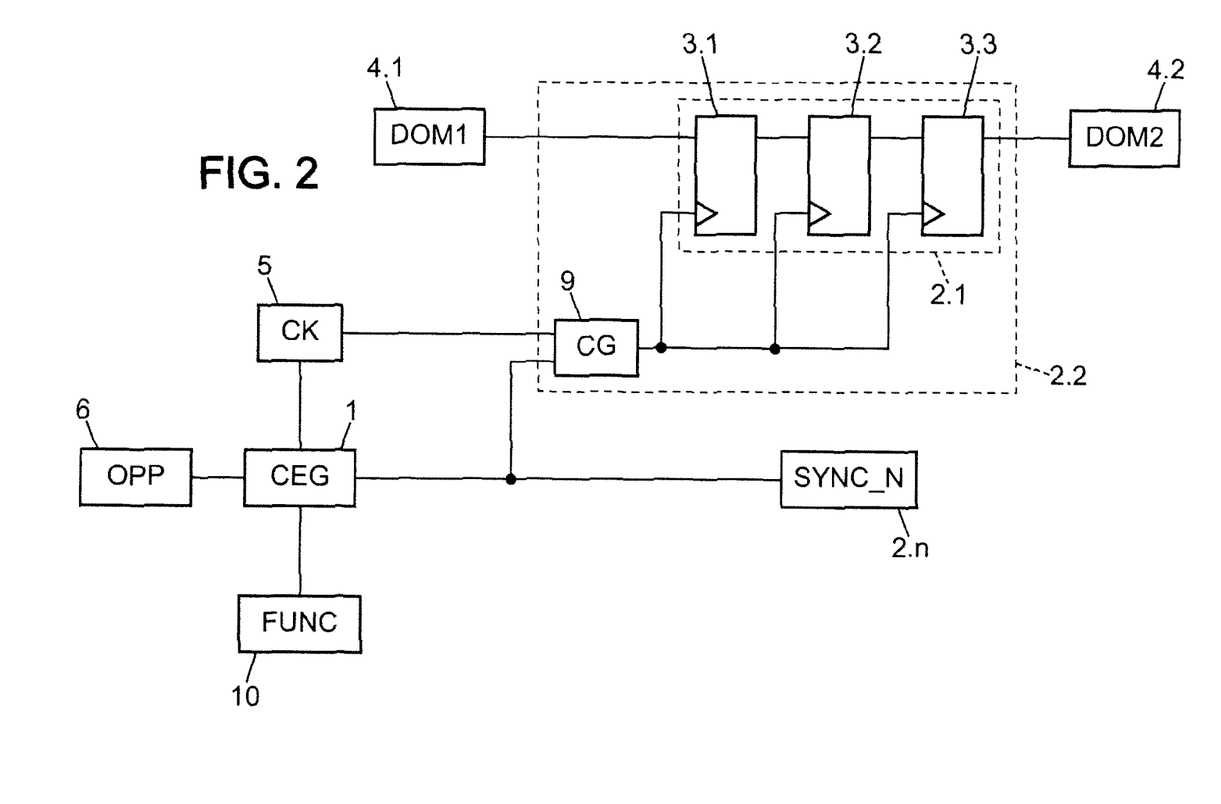
FIG. 2 shows a block diagram of a signal synchronization circuit according to some other embodiments.

Referring now to FIG. 2, there is shown a signal synchronization circuit according to some other embodiments of the invention. It is to be noted that the common references with FIG. 1 refer to the same entities. According to these embodiments, a functional clock enable is used to change frequency (high toggling rate). Thus, the functional clock enable is directly transmitted to the clock signal generator 1 by a frequency control unit 10. The clock signal generator is thus enabled by the functional clock enable. The modulated clock signal of the clock signal generator can be transmitted to other synchronizers having the same clock and the same functional clock enable.

Figure 3:
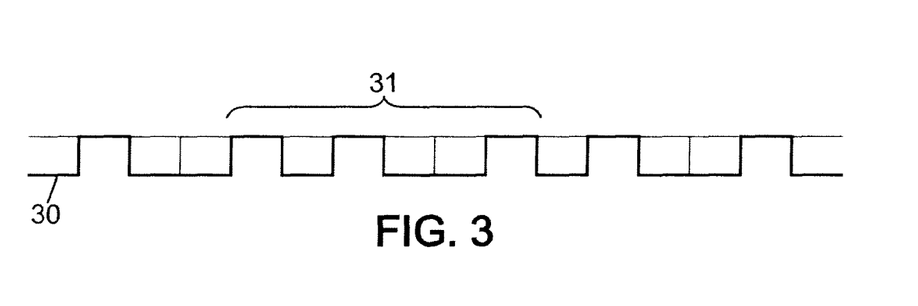
FIG. 3 is a timing diagram of an example of a modulated clock signal generated by a clock signal generator.

Referring to FIG. 3, there is shown a diagram 30 representing the modulated clock signal generated by the clock signal generator 1, according to some embodiments of the invention. In this example, three virtual flip-flops have to be generated (total_number_ffs=3+3=6). As detailed in Table 1, the modulated clock signal (enable sequence) generated by the clock signal generator 1 comprises 00101, 00101, 00101. Thus, over a period 31 comprising six clock cycles of the clock 5, three pulses are generated so that a total number of six flip-flops are simulated.

Figure 4:
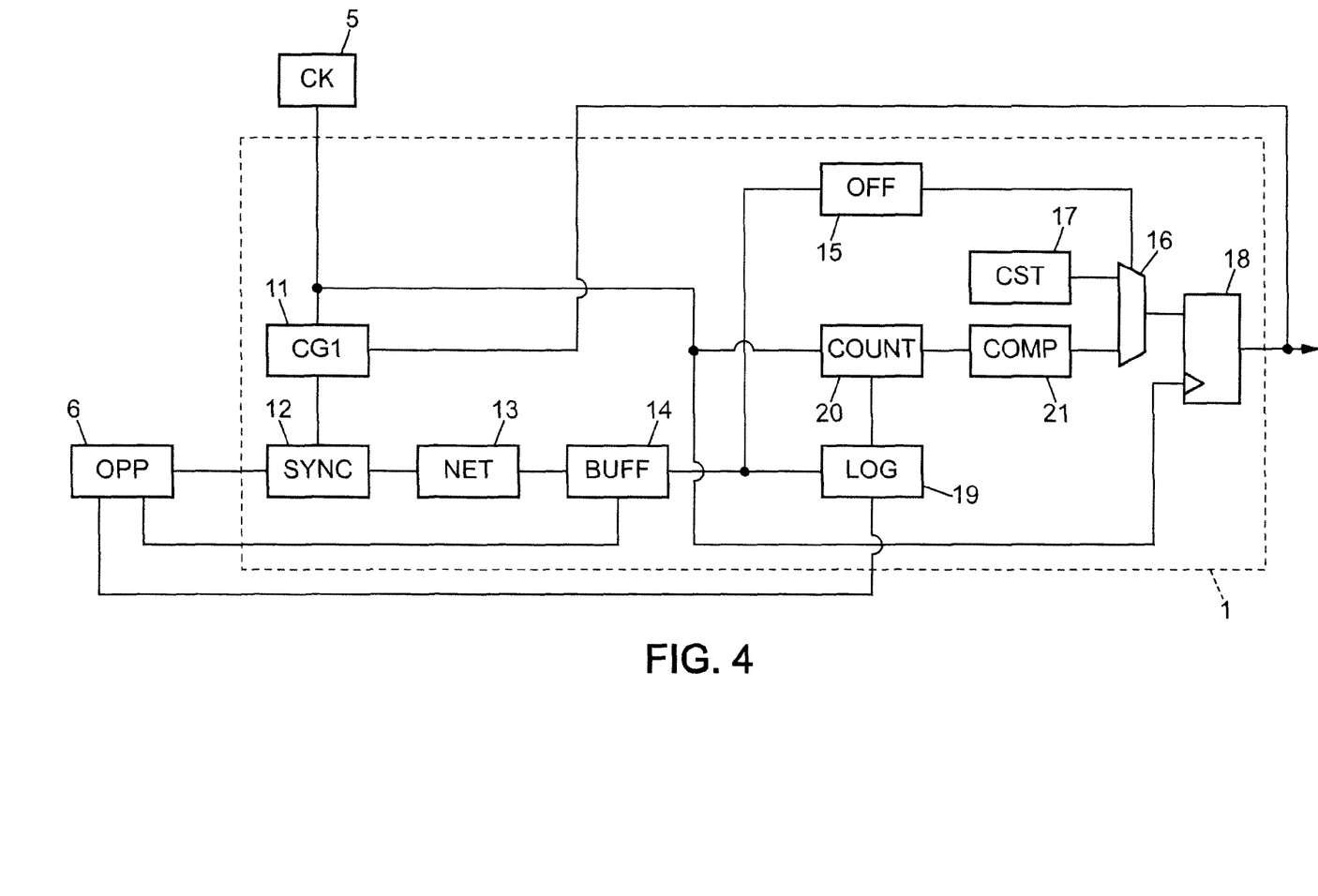
FIG. 4 is a block diagram of a clock signal generator, according to some embodiments; and, FIG. 5 is a flowchart illustrating steps of a method according to some embodiments of the invention.

Referring now to FIG. 4, there is shown a detailed structure of the clock signal generator 1, according to some embodiments of the invention.

The clock signal generator 1 comprises a first clock gate 11 that is adapted to receive as input the clock signal of the clock 5 and which is controlled by the output of the clock signal generator (modulated clock signal, i.e. the enable sequence). The output of the first clock gate 11 is connected to a synchronization unit 12 in accordance with the invention. According to some embodiments of the invention, the synchronization unit 12 can also comprise three flip-flops (not shown in FIG. 4.)

The synchronization unit 12 is adapted to receive a strobe signal from the operating point database 6, after the operating point database has transmitted the number resync_stage_nb of virtual flip-flops to be simulated to a buffer 14 of the clock signal generator 1. The strobe signal enables to indicate that the value resync_stage_nb is valid and has to be reloaded. The synchronization unit 12 is connected to a raising edge detector 13, which is adapted to detect that the strobe signal has been received (by detected a rising edge of the strobe signal) and which is connected to the buffer 14 to indicate it that the value resync_stage_nb can be reloaded.

When the value resync_stage_nb is equal to 0, the buffer is adapted to send control data to an inhibition unit 15 that forces a multiplexer 16 to always deliver the value 1. This corresponds to the case where the number of required flip-flops is equal to the number of physical flip-flops already contained in the synchronizer. Thus, in accordance with Table 1, the clock signal generator delivers a sequence comprising a series of 1. These values are transmitted to a flip-flop 18 that is toggled at each clock cycle of the clock 5.

When the value resync_stage_nb is greater than 0, the value of resync_stage_nb stored in buffer 14 is transmitted to count logic unit 19 which also contains the number phys_stage_nb of physical flip-flops of the synchronizers. The number phys_stage_nb stored in the count logic unit 19 is a design parameter that can be made equal to the present number of flip-flops in the synchronizers to be driven (for example in a range from 2 to 9). The clock signal generator further comprises a counter 20. In what follows, one can consider that the counter 20 is a 4-bit counter. However, no restriction is attached to the type of counter that is considered. The counter 20 is also connected to the count logic unit 19 and then can access the current values resync_stage_nb and phys_stage_nb.

The counter is also connected to the clock 5 and is adapted to implement the following incrementation and decrementation scheme.

The value of the counter 20 can be compared with 8 by a comparator unit 21. At each cycle, if the value of the counter 20 is less than 8, then the counter value can be incremented by the number (phys_stage_nb−1). Otherwise, the counter value can be decremented by (resync_stage_nb). When the counter value is equal to 8 or more, the comparator forces the multiplexer 16 to have a 1 as output, the output of the multiplexer 16 being connected to the flip-flop 18. Thus, each time the counter value is equal to 8 or more, no clock pulse is stolen from the clock signal of the clock 5. When the counter value is less than 8, the comparator 21 delivers a 0, so that the output of the multiplexer 16 is low and a clock pulse is stolen by the flip-flop 18 from the clock signal of the clock 5. The counter value can be initialized to 7 for example.

Thus, over a long period of time, the number of cycles during which the counter value is less than 8 is noted Ninc and the number of cycles during which the counter value is 8 or more is noted Ndec, and the following expression is obtained:

$$Ninc*(phys\_stage\_nb-1)=Ndec*resync\_stage\_nb$$

At the output of the clock signal generator 1 (i.e. output of the flip-flop 18), the ratio of the number of high cycles to low cycles is:

$$\frac{Ndec}{Ninc} = \frac{(phys\_stage\_nb - 1)}{resync\_stage\_nb}$$

The effective number of flip-flops of the synchronizer 2.1-2.2 is the number of cycles it takes to obtain phys_stage_nb high cycles at the output of the clock signal generator 1, including the first and the last high cycle.

The number of low cycles between the first and last high cycles is equal to resync_stage_nb since this is the number of low cycles produced for every (phys_stage_nb−1) high cycles. Thus, the effective number of flip-flops (physical and virtual) is equal to (phys_stage_nb+resync_stage_nb).

Figure 5:
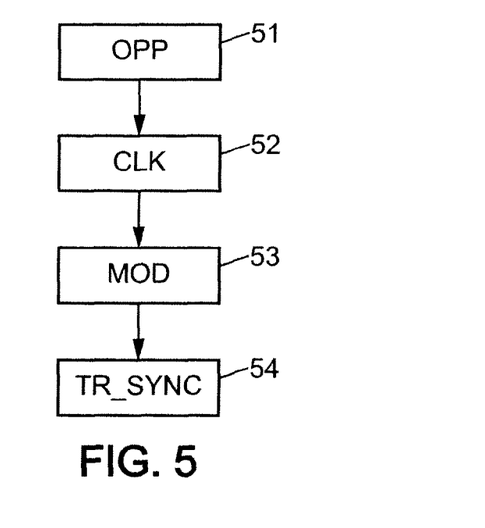

Referring to FIG. 5, there is shown a flowchart representing the steps of a method according to some embodiments of the invention.

At a step 51, operating values can be defined based on a desired increase in a synchronization time shift introduced by the synchronizer for example. The operating values can correspond to the numbers phys_stage_nb and _resync_stage_nb, as it has been previously explained.

At step 52, a clock signal is received from the clock 5.

At step 53, the clock signal is modulated based on the operating values to obtain a modulated clock signal.

At step 54, the modulated clock signal is used to (directly or indirectly) control the toggling of the flip-flops 3.1-3.2, so that a number resync_stage_nb of virtual additional flip-flops is simulated.

As many as needed modulated clock signal generators can be implemented in the circuit, according to the invention. Sometimes, a generator can be shared between several synchronizers with the same number of physical flip-flops and sharing the same clock or clock functional enable.

A brute rule can be that a generator is needed for each clock domain 4.1-4.2. However, some rules, which are listed hereafter, can help to reduce the number of clock signal generators.

In some embodiments, the clock 5 of the synchronizer 2.1-2.2 can be initially gated (or the corresponding clock enable) or may result from a clock multiplexer. The order of these operations (gating, multiplexing, fast toggling) and the modulation of the synchronizer 2.1-2.2 can be set based on the following rules:

the modulated clock signal of the synchronizer has to be synchronous of the parent clock 5 so a clock signal generator has to be implemented for each asynchronous clock;

when clocks are multiplexed in a glitch-free manner, the modulated clock signal can be obtained by multiplexing clock enables from the clock signal generators clocked by the incident clocks;

when a clock is gated by a pseudo-static control, the modulated clock signal can be modified by gating the modulated clock signal that is output by the clock signal generator clocked by the incident clock;

when a clock is divided by an integer ratio or gated by a fast-toggling control, the modulated clock signal cannot be modified by clocking the modulated clock signal with the incident clock and has to be generated by the clock signal generator clocked by the resulting divided or gated clock.

The present invention can also be embedded in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the invention as broadly defined above.

A person skilled in the art will readily appreciate that various parameters disclosed in the description may be modified and that various embodiments disclosed and/or claimed may be combined without departing from the scope of the invention.

The invention claimed is:

1. A signal synchronization circuit comprising:
   at least one synchronizer comprising a number N of series connected clock delay elements, N being equal to or greater than unity the synchronizer being adapted to adapt an asynchronous signal originating from a first clock domain, to a second clock domain;
   a clock signal generator arranged for generating a modulated clock signal adapted to clock the N clocked delay elements of the at least one synchronizer, wherein the clock generator is arranged to receive a clock signal and at least one operating value and to generate the modulated clock signal from said clock signal modified based on said operating value; and
   a clock gate with an input and an output, said input being arranged to receive the clock signal and said output being adapted to output the modulated clock signal from the clock signal generator, the clock gate being controlled by a control signal generated by the clock signal generator based on said operating value, wherein the operating value is tied to a desired increase in a synchronization time shift introduced by the synchronizer.

2. The circuit of claim 1, wherein the operating value is tied to, preferably is representative of the number N of clock delay elements of the synchronizer, e.g., is equal to N.

3. The circuit of claim 1, wherein the operating value is tied to at least one of a manufacturing process, operation voltage or temperature condition of the synchronizer.

4. The circuit of claim 1, wherein the synchronizer comprises a clock gate with an input and an output, said input being arranged to receive the clock signal and said output being adapted to output a gated modulated clock signal from the clock signal generator, the clock gate being controlled by the modulated clock signal of the clock signal generator.

5. The circuit according to claim 1, wherein the modulated clock signal is generated based further on a number M of clock delay elements which are necessary for the synchronizer to introduce a given time shift to the clock signal, M being greater than N, and wherein for a time sequence during which the clock signal comprises M rising edges, the modulated clock signal comprises N rising edges wherein the circuit further comprises a counter, said counter being adapted to update a counter value, and wherein, at each rising edge of the clock signal, if the counter value is below a given threshold, the edge of the modulated clock signal is caused to be low and the counter value is incremented by M−N, and else, the edge of the modulated clock signal is caused to be high and the counter value is decremented by N−1.

6. The circuit according to claim 1, comprising at least two synchronizers, and wherein the modulated clock signal is adapted for clocking the clock delay element or elements of the synchronizers.

7. The circuit of claim 1, wherein the synchronizer comprises the clock gate.

8. The circuit of claim 1, wherein the clock signal generator comprises the clock gate.

9. A signal synchronization method comprising:
   receiving a clock signal and at least one operating value;
   generating a modulated clock signal from said clock signal modified based on said operating value, said modulated clock signal being adapted for clocking a number N of series connected clock delay elements of at least one synchronizer, N being equal to or greater than unity, the synchronizer being adapted to adapt an asynchronous signal originating from a first clock domain, to a second clock domain;
   receiving, by an input of a clock gate, the clock signal; and
   providing, by an output of the clock gate, the modulated clock signal to one of the clock delay elements, wherein the clock gate is controlled by a control signal based on the operating value,
   wherein the operating value is tied to a desired increase in a synchronization time shift introduced by the synchronizer.

10. The method according to claim 9, wherein the modulated clock signal is generated based further on a number M of clock delay elements which are necessary for the synchronizer to introduce a given time shift to the clock signal, M being greater than N, and wherein for a time sequence during which the clock signal comprises M rising edges, the modulated clock signal comprises N rising edges, and wherein, the method further comprises:
   if a value of a counter is below a given threshold, the edge of the modulated clock signal is caused to be low and the counter value is incremented by M−N;
   else, the edge of the modulated clock signal is caused to be high and the counter value is decremented by N−1.

11. The method of claim 9, wherein the operating value is tied to, preferably is representative of the number N of clock delay elements of the synchronizer, e.g., is equal to N.

12. The method of claim 9, wherein the operating value is tied to at least one of a manufacturing process, operation voltage or temperature condition of the synchronizer.

13. A computer program product comprising a non-transitory computer readable medium having stored thereon computer program instructions loadable into a computing device, wherein the computer program instructions cause the computing device to:
   receive a clock signal and at least one operating value;
   generate a modulated clock signal from said clock signal modified based on said operating value, said modulated clock signal being adapted for clocking a number N of series connected clock delay elements of at least one synchronizer,
   N being equal to or greater than unity, the synchronizer being adapted to adapt an asynchronous signal originating from a first clock domain, to a second clock domain;
   receive, by an input of a clock gate, the clock signal; and
   provide, by an output of the clock gate, the modulated clock signal to one of the clock delay elements, wherein the clock gate is controlled by a control signal based on the operating value, wherein the operating value is tied to a desired increase in a synchronization time shift introduced by the synchronizer.

14. The computer program product according to claim 13, wherein the modulated clock signal is generated based further on a number M of clock delay elements which are necessary for the synchronizer to introduce a given time shift to the clock signal, M being greater than N, and wherein for a time sequence during which the clock signal comprises M rising edges, the modulated clock signal comprises N rising edges, and wherein, the computer program instructions further causing the computing device to:
   if a value of a counter is below a given threshold, the edge of the modulated clock signal is caused to be low and the counter value is incremented by M−N;
   else, the edge of the modulated clock signal is caused to be high and the counter value is decremented by N−1.

15. The computer program product according to claim 13, wherein the operating value is tied to, preferably is representative of the number N of clock delay elements of the synchronizer, e.g., is equal to N.

16. The computer program product according to claim 13, wherein the operating value is tied to at least one of a manufacturing process, operation voltage or temperature condition of the synchronizer.

* * * * *